(12) United States Patent
Barabi et al.

(10) Patent No.: US 7,663,388 B2
(45) Date of Patent: Feb. 16, 2010

(54) ACTIVE THERMAL CONTROL UNIT FOR MAINTAINING THE SET POINT TEMPERATURE OF A DUT

(75) Inventors: Nasser Barabi, Lafayette, CA (US);
Elena Nazarov, San Mateo, CA (US);
Joven R. Tienzo, Fremont, CA (US);
Chee-Wah Ho, San Jose, CA (US)

(73) Assignee: Essai, Inc., Fremont, CA (US)

( * ) Notice: Subject to any disclaimer, the term of this patent is extended or adjusted under 35 U.S.C. 154(b) by 111 days.

(21) Appl. No.: 12/080,248

(22) Filed: Mar. 31, 2008

(65) Prior Publication Data
US 2008/0252324 A1 Oct. 16, 2008

Related U.S. Application Data

(60) Provisional application No. 60/921,166, filed on Mar. 30, 2007.

(51) Int. Cl.
*G01R 31/26* (2006.01)
(52) U.S. Cl. ........................................ 324/760
(58) Field of Classification Search ............. 324/158.1, 324/750–755, 760–765; 250/310–311; 439/482, 439/824
See application file for complete search history.

(56) References Cited

U.S. PATENT DOCUMENTS

| | | | |
|---|---|---|---|
| 4,734,872 A | 3/1988 | Eager et al. | |
| 5,475,317 A | 12/1995 | Smith | |
| 5,977,785 A | 11/1999 | Burward-Hoy | |
| 6,191,599 B1 | 2/2001 | Stevens | |
| 6,518,782 B1 | 2/2003 | Turner | |
| 6,552,561 B2 | 4/2003 | Olsen et al. | |
| 6,559,665 B1 | 5/2003 | Barabi | |
| 7,190,184 B2 * | 3/2007 | Haji-Sheikh et al. | 324/760 |
| 7,202,684 B2 * | 4/2007 | Fenk | 324/760 |

* cited by examiner

*Primary Examiner*—Ha Tran T Nguyen
*Assistant Examiner*—Trung Q Nguyen
(74) *Attorney, Agent, or Firm*—Donald L. Beeson; Beeson Skinner Beverly

(57) ABSTRACT

A thermal control unit (TCU) for maintaining the set point temperature of an IC device under test (DUT) has a thermoelectric module (a Peltier device), a fluid circulation block, a lower pedestal assembly containing a thermal sensor, and an upper cover housing arranged in a stacked relationship along the z-axis of the TCU. A z-axis compliant force is supplied from the TCU's cover housing by means of a spring-loaded pusher mechanism that supplies a compliant spring force to the stacked arrangement of the fluid block, peltier device, and pedestal assembly. The z-axis compliant force provided by the spring-loaded pusher mechanism produces efficient thermal contact between the peltier device and the stacked components of the TCU containing the peltier device and allows the peltier device to expand and contract within the TCU to extend the life of the peltier device. An alternative quick disconnect feature allows the electrical leads of the thermal sensor in the pedestal assembly to automatically make electrical connection with associated wiring in the cover housing when the cover housing is secured to the pedestal assembly.

16 Claims, 9 Drawing Sheets

ACTIVE THERMAL CONTROL UNIT FOR MAINTAINING THE SET POINT TEMPERATURE OF A DUT

CROSS-REFERENCE TO RELATED APPLICATIONS

This application claims the benefit of U.S. provisional application Ser. No. 60/921,166 filed Mar. 30, 2007.

BACKGROUND OF THE INVENTION

The present invention generally relates to the testing of IC chips, and more particularly relates to devices for maintaining the temperature of an integrated circuit (IC) device under test (DUT).

Testing IC chips under thermally controlled conditions requires that a certain temperature be maintained for the DUT, which usually requires raising or lowering the DUT's temperature during the course of the test. Thermal control units have been devised for this purpose. Such units provide thermal contact with the DUT and carry heat away from or add heat to the DUT as required based on a predetermined set point temperature. Such units frequently use a peltier device as a heat pump to achieve such temperature control. Peltier devices are solid-state devices that come in small thin geometries and that can be controlled by a DC current to pump heat away from a contacted device for removal. By reversing the current, the Peltier device act as a heater by pumping heat into a contacted device.

In thermal control units for IC testing, the ability of the peltier device to efficiently transfer heat to and away from the DUT is affected by the contact between the Peltier device and the other components of the thermal control unit, including the thermal sensor containing pedestal that contacts the DUT. Efficient heat transfer requires large forces pushing the heat transfer surfaces of the Peltier device, typically forces that exceed 100 psi. The rigid mechanical designs heretofore used in DUT thermal control units to generate these required clamping forces tend to cause the components of the unit to bend or bow in a manner that interferes with thermal contacts made with the Peltier device, resulting in a degradation in the heat transfer capabilities of the device. The present invention is directed at overcoming these problems and to providing a thermal control unit that can have other beneficial features.

DETAILED DESCRIPTION OF THE ILLUSTRATED EMBODIMENT

Figure 1:
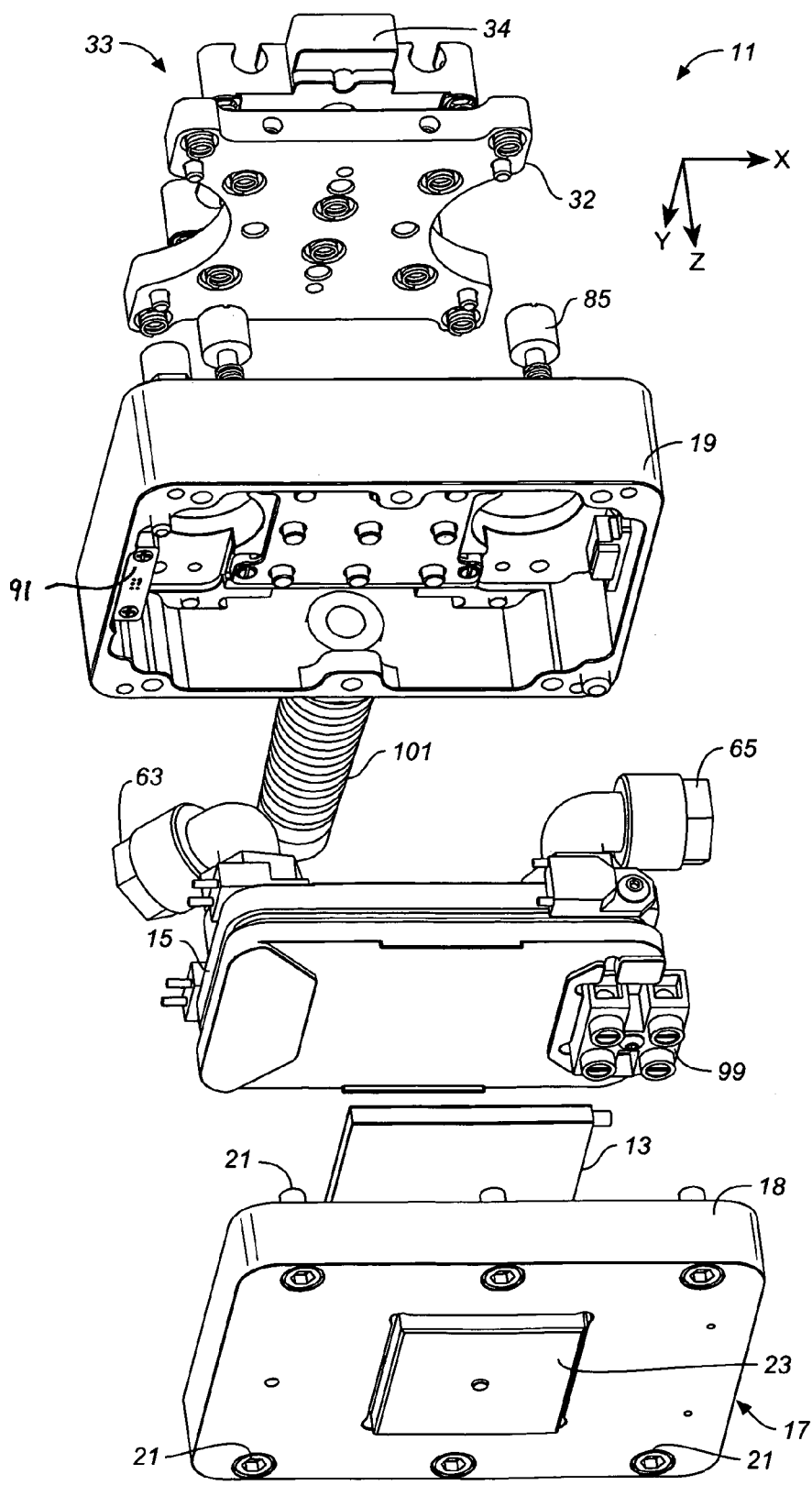
FIG. 1 is an exploded bottom perspective view of an active thermal control unit (TCU) in accordance with the invention shown with a gimbal system for exerting a pushing force on the TCU and against a DUT in an IC test socket.

Referring now to the drawings, the illustrated active thermal control unit (TCU), generally denoted by the numeral 11, is comprised of a peltier device 13 (also known as a "thermoelectric module"), a fluid circulation block 15, a lower pedestal assembly 17, and an upper cover housing 19 arranged in a stacked relationship along the z-axis of an x-y-z coordinate system denoted by the x,y,z coordinate arrows shown in the drawings. The cover housing, which is secured to the outer pedestal frame 18 of the pedestal assembly by means of mounting screws 21, contains and holds the peltier device and fluid block in a contacting relationship over the pedestal assembly so that heat transfer can occur between these TCU components as later described. The pedestal assembly 17 provides thermal contact with a DUT through a heat-conductive pedestal 23, which has a top wall 25 and a bottom pusher end 27. A retainer ring 29, which screws onto the underside of the pedestal frame 18 by means of screws 31, holds the pedestal to the pedestal frame.

The materials used for fabricating the components of the TCU would be readily apparent to persons skilled in the art. For example, the fluid circulation block 15 would most suitably be made of copper for efficient heat conduction. The frame 18 of the pedestal assembly 17 along with the upper cover housing 19 can suitably be made of stainless steel or anodized aluminum.

Figure 1A:
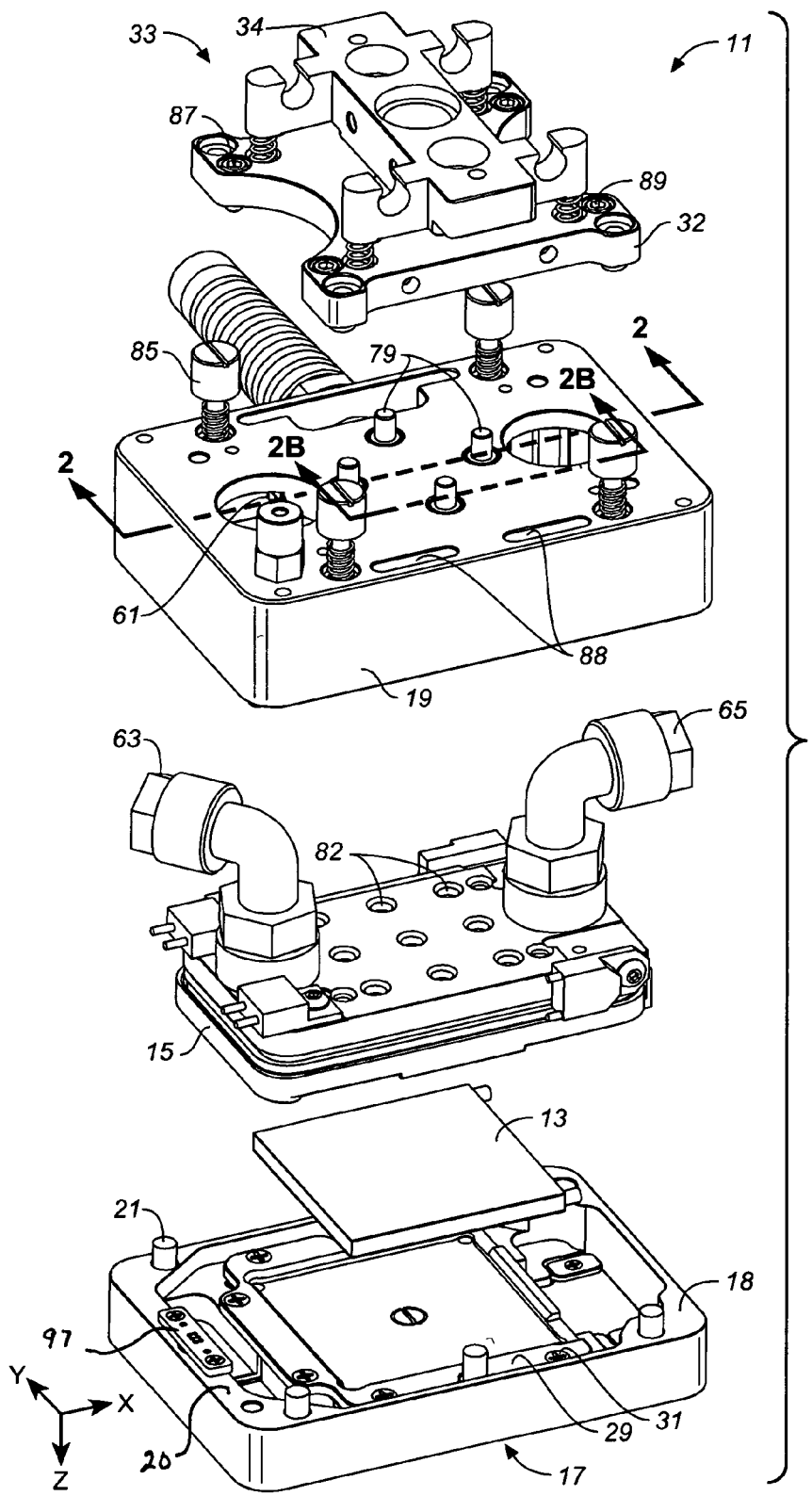
FIG. 1A is an exploded top perspective view thereof.

When in use, the TCU, along with the gimbal system 33 shown in FIGS. 1 and 1A, is housed in a test box (not shown) which is placed over a test socket (also not shown) containing a DUT. A pusher element in the test box will push on the TCU through the gimbal system 33 so that the pusher end 27 of the TCU's pedestal 23 engages and holds the DUT in the test socket with a true z-axis force. When so engaged, the thermal measurement and control elements of the TCU act to monitor and maintain the DUT's set point temperature.

The DUT temperature is monitored by a thermal sensor 35 in the pusher end of the pedestal 25. In the illustrated embodiment and as best seen in FIG. 2A, this temperature sensor is contained within a heat conductive, cup-shaped sensor capsule 37 inserted into a pedestal sensor cavity 39 having a small sensor opening 41 at the pusher end of the pedestal. The sensor capsule, which is held in the sensor cavity by set screw 43, compression spring 45, and retainer cap 46, preferably has an angled shoulder 47, which seats against a beveled seating surface 49 at the bottom of the sensor cavity as a result of the biasing force exerted by the compression spring. In this biased position, the thermal sensor capsule extends slightly beyond the bottom pusher end of the pedestal to provide for compliant contact with the DUT. A bore 51 through the side of the pedestal provides a passageway through the pedestal for bringing out the sensor leads 53. It is noted that this bore is suitably sized so that the sensor leads will not be pinched when the sensor capsule is depressed on contact. It is further noted that the sensor capsule should be fabricated of a heat conductive material, suitably copper, while the retainer cap, which is placed over the sensor capsule and which has a suitable side edge opening for the sensor leads, is suitably a plastic part.

The peltier device 13, which is placed between the pedestal 23 of the pedestal assembly and the fluid block 15, acts as a solid state heat pump for controlling heat flow between these components of the TCU. Heat transfer between the pedestal and fluid block can be regulated in accordance with the temperature of the DUT as detected by the thermal sensor, with heat being removed from the pedestal to a fluid being circulated through the fluid block when it is desired to lower the DUT temperature, and with heat being added to the pedestal from the circulating fluid if the DUT temperature needs to be raised. To help achieve an efficient interface, a thermal interface material, such as a thermal grease or foil (for example, an Egraf™ foil), is preferably provided between the pedestal's top wall 27 and the peltier device, and between the peltier device and the fluid block. However, for the TCU to operate efficiently, the fluid block, peltier device, and pedestal must additionally be held together under a substantial z-axis force (in excess of 100 psi in certain applications) in order to achieve suitable heat transfer across the interfaces of these components. As described below, one aspect of the invention is to supply a suitable and controlled force in a compliant mechanical structure that will allow the peltier device to expand and contract, and that will extend the life of the peltier device. This z-axis compliant force is supplied from the TCU's cover housing 19 by means of a spring-loaded pusher mechanism described below.

The cover housing 19 is seen to include a top wall 54 having a top side 55 and a bottom side 57, and perimeter side walls 59. (Fluid line coupler openings 61 are provided in the top wall to accommodate inlet and outlet fluid couplers 63, 65 connected to threaded fluid inlet and outlets 67, 69 in the top of the fluid block 15.) The spring-loaded pusher mechanism is provided at the top wall of the cover housing. This mechanism is comprised of a pusher plate 73 and a plurality compressed springs, most suitably stacked disc springs 71, which are distributed behind and are held in position by the pusher plate. As best shown in FIG. 2B, the pusher plate is held to the bottom side of the cover housing's top wall by means of shoulder screws 75, which will allow for a small degree of z-axis travel of the pusher plate when compressive forces are exerted on the pusher plate. The pusher plate is preferably fabricated of plastic so as to provide a degree of thermal insulation between the fluid block and upper cover housing.

More specifically, the cover housing's top wall is seen to have a series of extended alignment pins 79 and shorter stub alignment pins 81 (suitably of stainless steel), which are suitably press fit into countersunk holes in the housing's top wall. (The extended alignment pins are press fit into the top wall of the cover housing from the top and the stub alignment pins are press fit into the top wall from the bottom.) The stacked disc springs 71 are inserted into and captured by spring cavities 77 formed on the bottom side of cover housing's top wall 54 by the countersunk portion of the alignment pin holes. The captured stack of disc springs alternate in direction and surround the alignment pins, and have a sufficient projection below the top wall's bottom side 57 to exert a downward biasing force on the pusher plate 73. Metal washers 83, suitably stainless steel washers and preferably placed over the alignment pins between the ends of the disc spring stack and the plastic pusher plate, serve to spread the spring force and protect the pusher plate. The number and size of the spring discs can be chosen to achieve a pre-determined force calculated to maximize heat transfer between the pedestal, peltier device, and fluid block.

It shall be understood that spring configurations other than the above-described and illustrated disc springs could by used to supply a compliant spring force to the stacked arrangement of the fluid block, peltier device, and heat conducting pedestal. For example, coil springs could be employed on the bottom side of the cover housing, or the cover housing could be configured so that leaf springs could exert the desired z-axis force. Disc springs have an advantage over coil springs in that a given amount of force can be generated in a relatively short distance, thereby minimizing the height of the cover housing.

Figure 2:
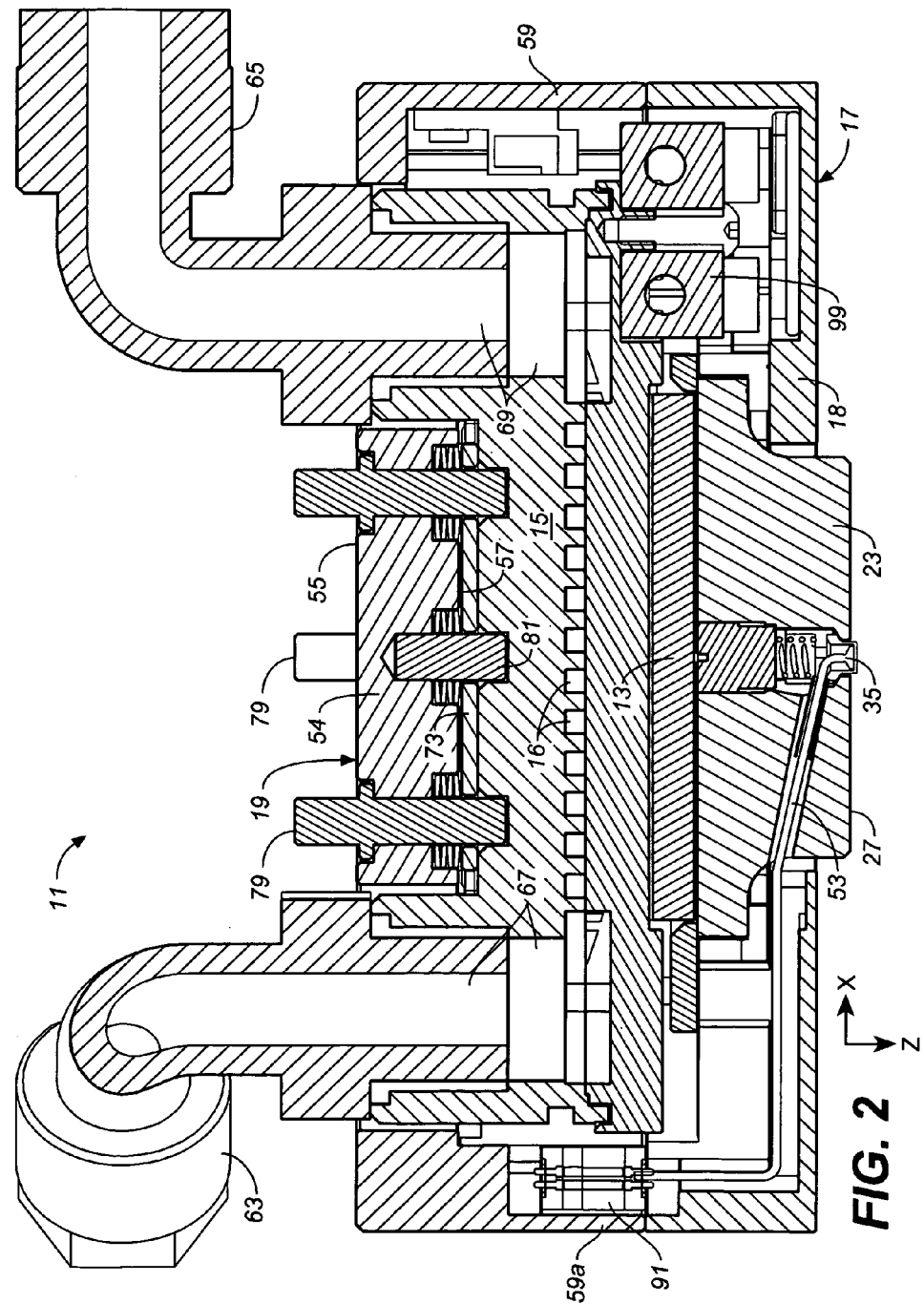
FIG. 2 is a cross-sectional view of the assembled TCU shown in FIGS. 1 and 1A, taken along lines 2-2 in FIG. 1A.
Figure 2A:
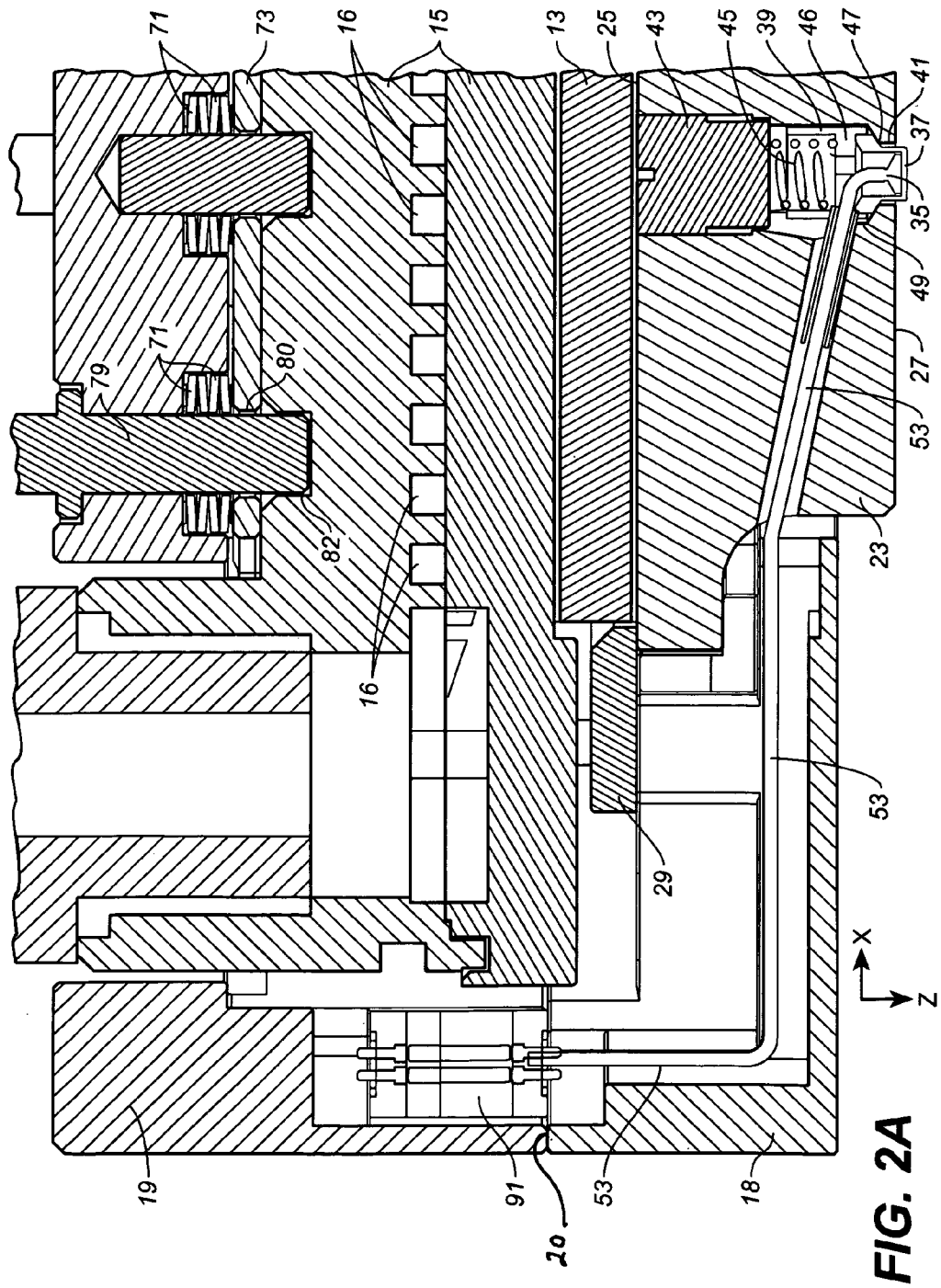
FIG. 2A is an enlarged fragmentary cross-sectional view of the TCU as shown in FIG. 2.
Figure 2B:
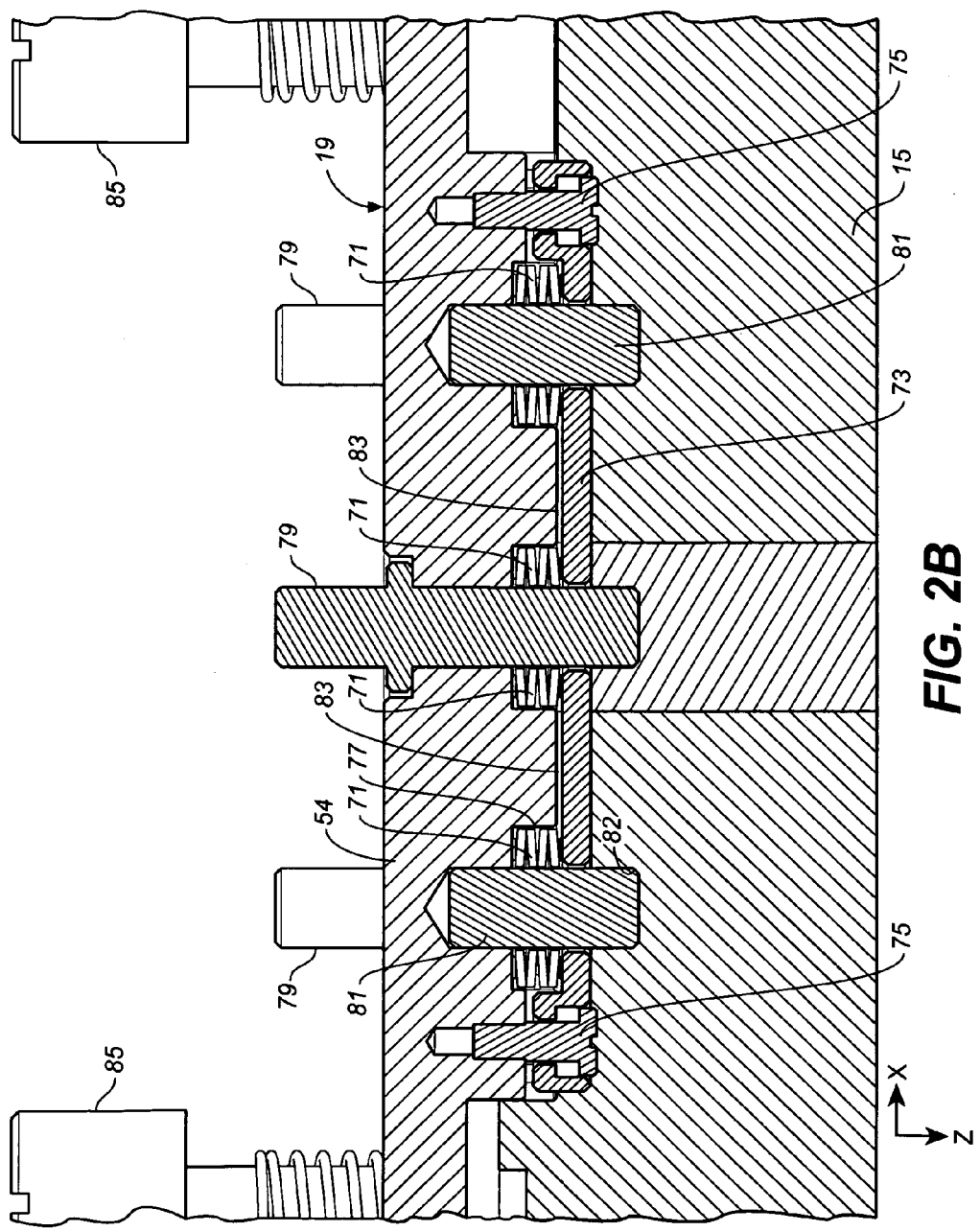
FIG. 2B is another enlarged fragmentary view of the assembled TCU taken along lines 2B-2B in FIG. 1A

When assembled as shown in FIG. 2, the bottom end of each of the extended and stub alignment pins 79, 81 are seen to engage corresponding pin holes in the pusher plate 73 (holes 80 in FIG. 2A) and in fluid block 15 (holes 82). The top ends of the extended alignment pins are also seen to extend through the top side of the cover housing for engaging the bottom mounting plate 32 of the gimbal system 33 shown in FIGS. 1A and 1B. These top extensions of the extended alignment pins are provided to align the gimbal system on top of the cover housing. The gimbal system, which further includes a top plate 34 spring mounted to the bottom plate 32, is secured to the top of the TCU cover housing by spring loaded screws 85 inserted through countersunk screw holes 87 in the corners of the gimbal bottom plate.

It is noted that the shown gimbal mounting configuration and pedestal assembly are intended for use in testing IHS chip packages. The shown configuration would be altered for a bare die chip package having a heat spreader. For instance, pusher arm side slots 88 will allow pusher arms to be added for actuating a pusher frame for the heat spreader of the bare die package. Additional mounting screw holes 89 in the bottom mounting plate 32 are also provided for the reconfiguration. A different design for the pedestal assembly 17 would also be used for bare die chip packages, one which would include a pedestal pushing configuration adapted for the bare die package, including a pusher frame.

Figure 4:
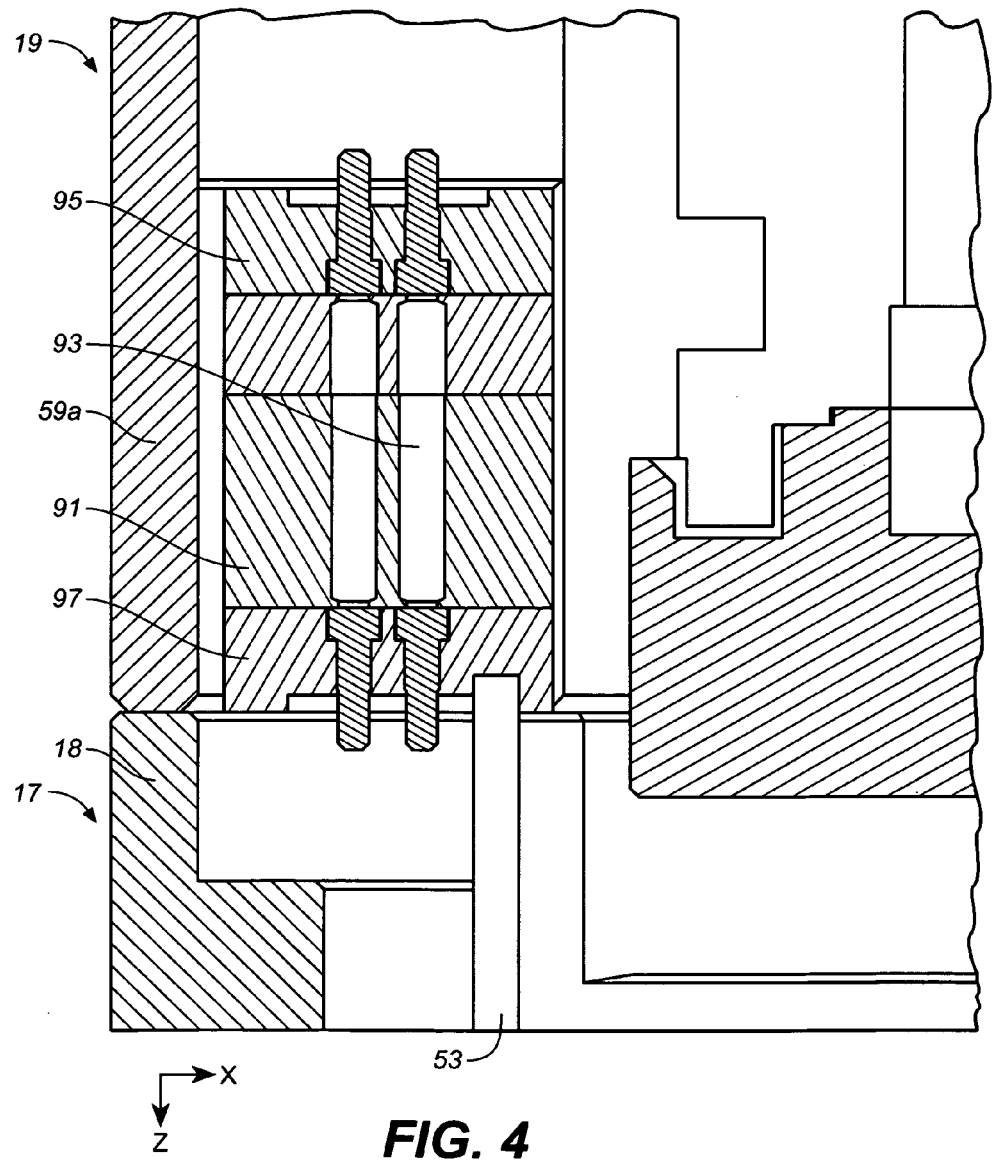
FIG. 4 is an enlarged fragmentary view, in cross-section, of the interposer provided at the perimeter interface of the cover housing and pedestal assembly of the TCU.
Figure 5:
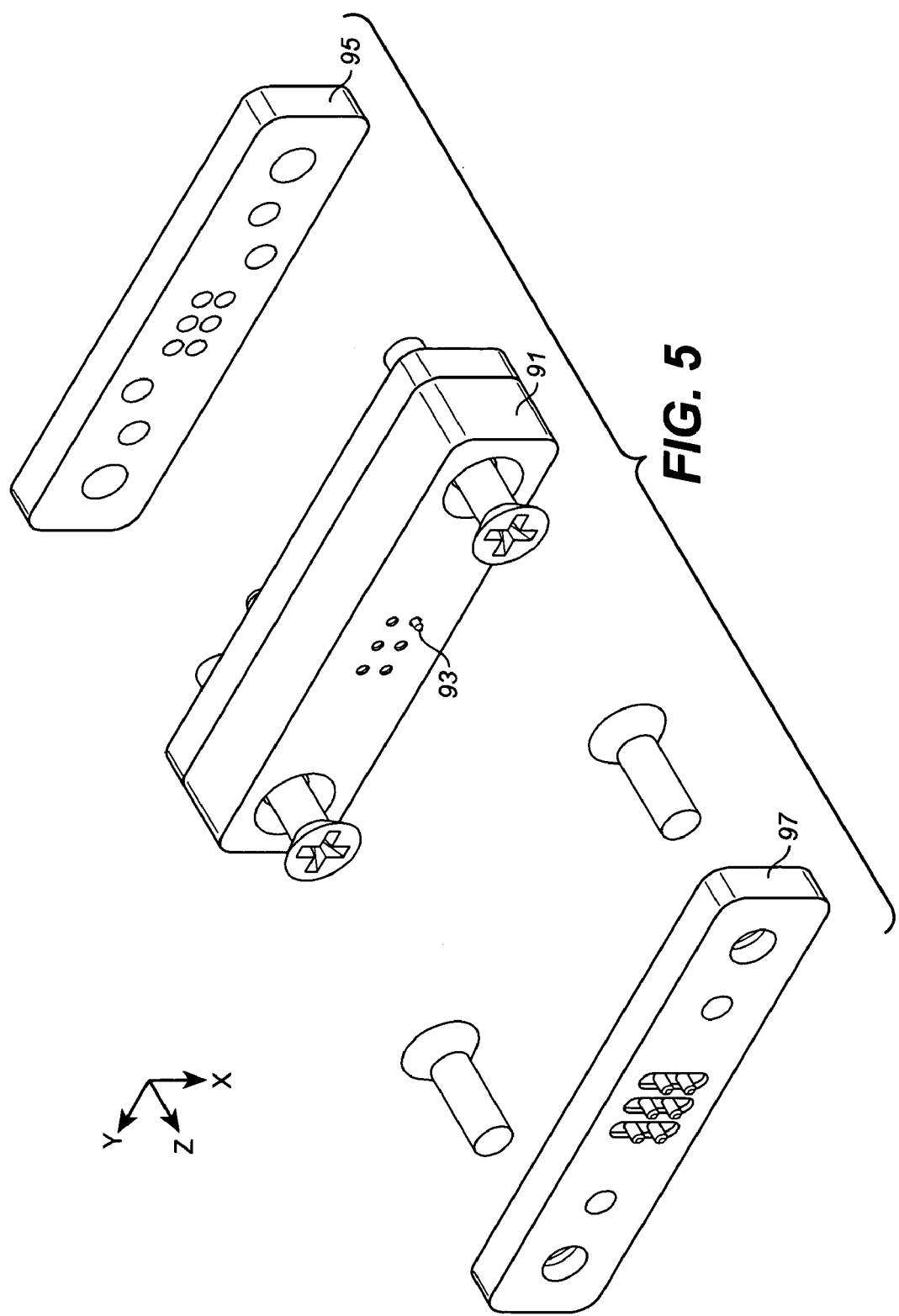
FIG. 5 is an exploded view of the interposer shown in FIG. 4.
Figure 6:
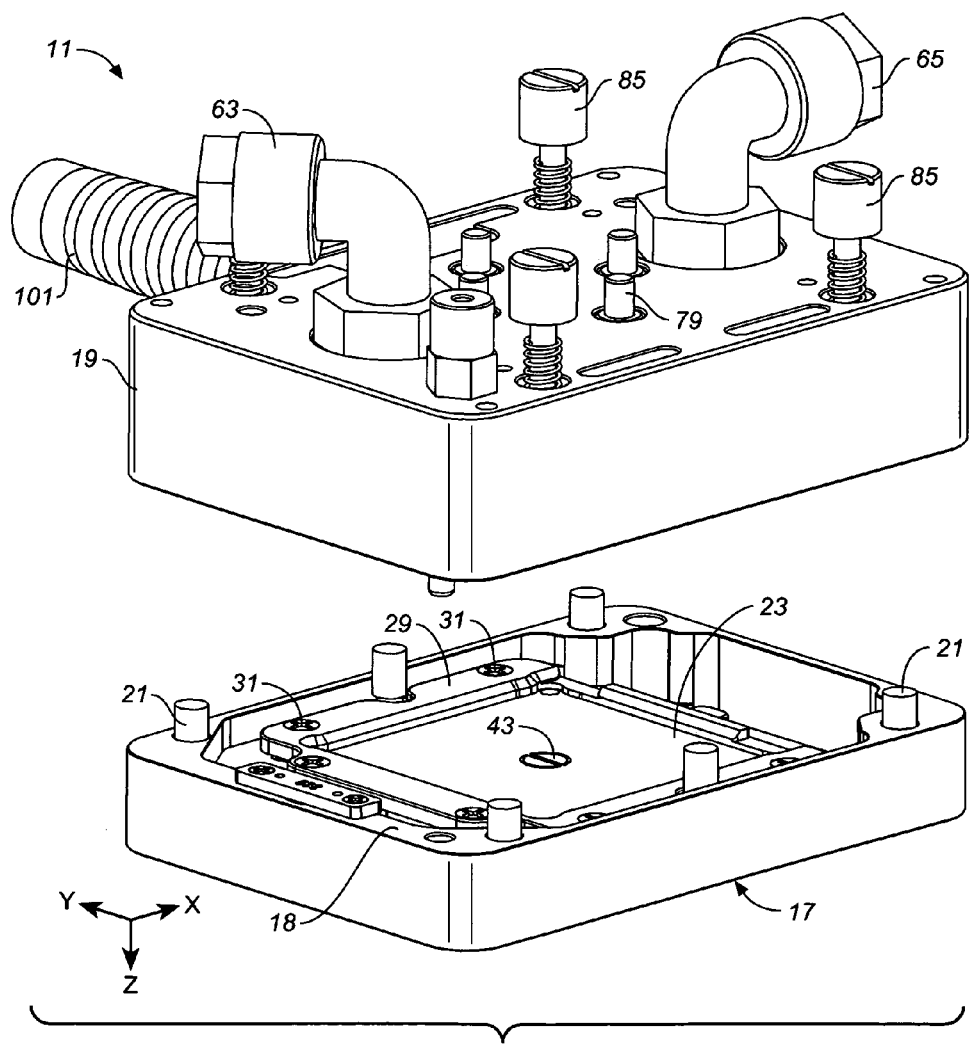
FIG. 6 is a top perspective view of the thermal control unit with the top cover housing and contained fluid block and peltier device exploded from the pedestal assembly.

In a further and alternative aspect of the invention, the TCU can be provided with a quick-disconnect feature, wherein the temperature sensor leads 53, which are threaded through the pedestal frame 18 and the cover housing 19, will automatically make an electrical connection to associated wiring in the cover housing when the cover housing is secured to the pedestal assembly. Specifically, a narrow interposer 91 having spring contact pins 93 (see FIGS. 4 and 5) is mounted at the bottom edge of side wall 59a of the cover housing beneath a top lead block 95 to which the associated wiring in the cover housing is connected. A corresponding bottom lead block 96 for the sensor leads is mounted to the top perimeter edge 20 of the pedestal frame side wall 97 for making contact with the interposer on the cover housing when the cover housing is placed on the pedestal assembly.

The wiring connections for the peltier device can suitably be made through a wire connector 99 (shown in FIG. 1) mounted to the bottom side edge of the fluid block so that it is positioned immediately adjacent the peltier device. The electrical wiring associated with the peltier device, as well as the electrical wiring in the cover housing associated with the thermal sensor, is passed out of the cover housing through wire conduit 101. Other optional electronic components can be provided in the TCU and wired through conduit 101, such as an electronic board for storing desired application-specific information.

To assemble the illustrated TCU, it is preferable that the pedestal assembly (which includes the heat conductive pedestal 23, the thermal sensor and associated parts, pedestal frame 18 and retainer ring 29), and the top portion of the TCU (which includes the cover housing, fluid block and spring loaded pusher mechanism, be pre-assembled separately. To pre-assemble the top portion of the TCU ("cover housing pre-assembly"), the disc springs 71 and pusher plate 73 must be installed on the bottom side of the cover housing 19, and the fluid block inserted onto the bottom ends of the alignment pins 79, 81 projecting from the bottom side of the cover housing top wall so as to center the fluid block in the x-y plane relative to the cover housing. The fluid inlet and outlet couplers 63, 65 for the external fluid lines can then be screwed down onto the threaded fluid inlet and outlet of the fluid block through the cover housing's fluid line coupler openings 61. It is noted that the fluid line openings 61 will have a sufficient diameter to provide clearance between the cover housing and the fluid inlet and outlet structures of the fluid block to allow z-axis travel of the fluid block during assembly of the TCU and as the peltier device expands and contracts.

When the cover housing pre-assembly is ready to be placed on the pre-assembled pedestal assembly, the leads of the peltier device 13 can be attached to electrical connector 99 to electrically connect the peltier device to its associated wiring in the cover housing. The cover housing pre-assembly and peltier device is then positioned over the pedestal assembly so that the peltier device can be placed in the pedestal retainer ring 29 of the pedestal assembly, which will center the peltier device in the x-y plane over the pedestal's top end 25.

Figure 3:
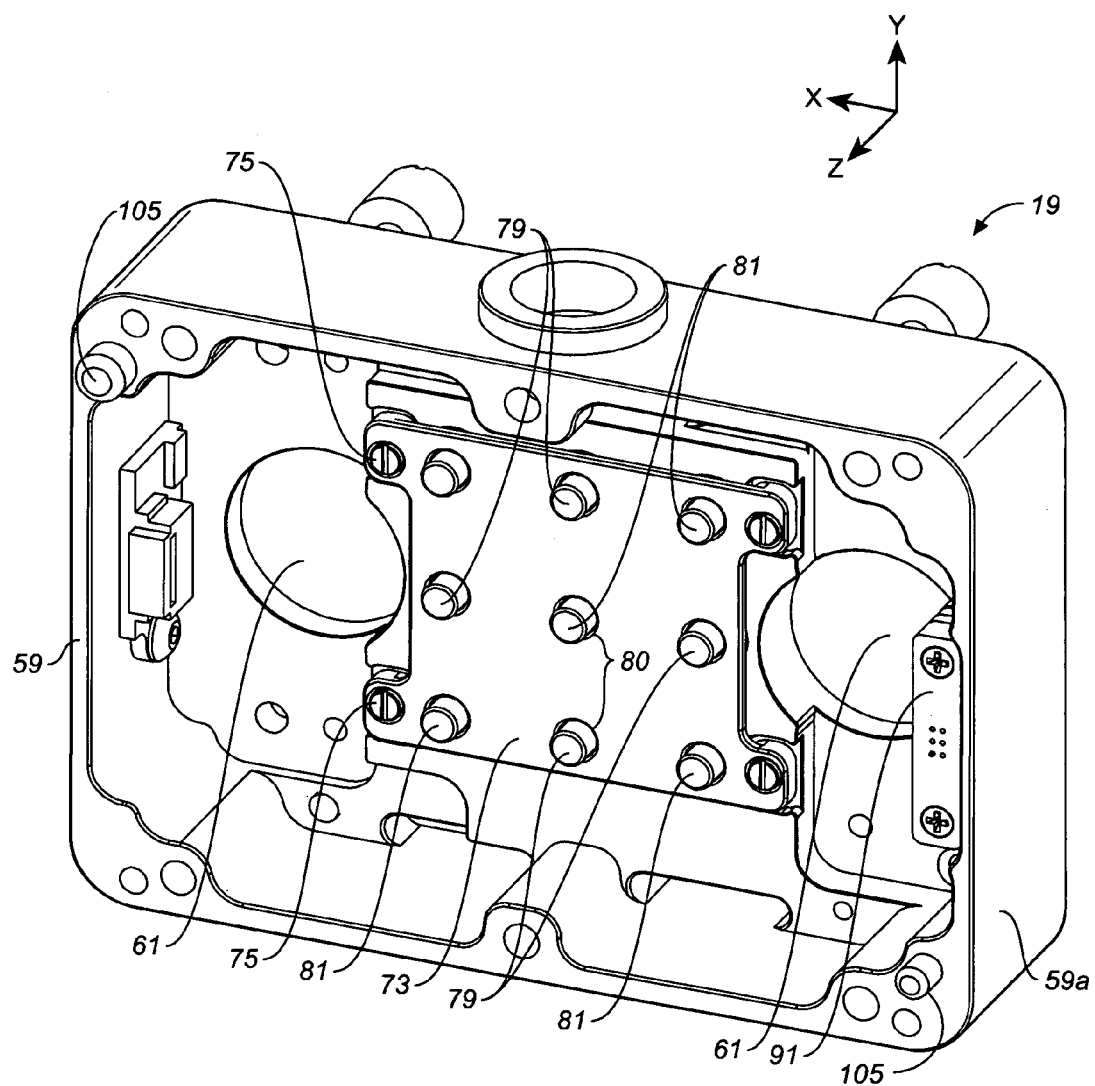
FIG. 3 is a bottom perspective view of the cover housing of the TCU shown in the foregoing figures.

It is noted that alignment pins 105 are suitably provided on the bottom perimeter of the cover housing side walls (as shown in FIG. 3) for engaging corresponding alignment pin holes on the pedestal frame. These alignment pins will provide for precise alignment between the cover housing and the pedestal assembly as the cover housing assembly is lowered onto the pedestal assembly. Once the cover housing pre-assembly is lowered onto the pedestal assembly, the mounting screws 21 are inserted from the bottom of the pedestal assembly as best shown in FIG. 1 and used to attach the cover housing to the pedestal assembly.

As the mounting screws 21 at the bottom of the pedestal assembly are screwed into the side walls of the cover housing, the cover assembly will be drawn down onto the outer pedestal frame 18, and the disc springs 71 on the bottom side of the cover housing will compress, thereby placing a compliant force on the peltier device. Also, as the cover housing is drawn down, the sensor leads will automatically connect to the associated wiring in the cover housing through the interposer 91. As above noted, the compliant force exerted on the peltier device will enhance heat transfer across the peltier device-fluid block interface and the peltier device-pedestal interface. At the same time, the compliance of the disc springs will allow the peltier device to expand and contract without damage, extending the life of the peltier device.

In use, a desired electrical signal is supplied to the peltier device from an external power source to generate the heat flow needed to maintain a desired set point temperature for the DUT in the test socket. The heat is either carried away or supplied by a fluid, suitably water, which is passed through fluid passages, such as parallel fluid passages 16 shown FIGS. 2 and 2A, passing through in the fluid block 15. The fluid block suitably is provided with two sets of parallel fluid passages oriented at ninety degrees to each other for efficient heat transfer.

While the present invention has been described in considerable detail in the forgoing specification and accompanying drawings, it shall be understood that it is not intended that the invention be limited to such detail.

We claim:

1. A thermal control unit for maintaining the set point temperature on an IC device under test (DUT) comprising
    a pedestal assembly having heat conductive pedestal having a bottom end for contacting a DUT and a temperature sensor in said bottom end for monitoring the temperature of the DUT,
    a fluid block above said pedestal assembly having a fluid inlet and fluid outlet for circulating a fluid therethrough,
    a thermoelectric module between the pedestal of said pedestal assembly and said fluid block for controlling the heat flow between said pedestal and fluid block for controlling the temperature of the DUT contacted by the bottom end of said pedestal,
    a cover housing attached to said pedestal assembly for containing the fluid block and thermoelectric module in stacked relation over the pedestal of said pedestal assembly along a z-axis, said cover assembly having a top wall extending over said fluid block, said top wall having a top side for receiving a z-axis pushing force and a bottom side, and
    a spring loaded pusher mechanism at the bottom side of the top wall of said cover housing for producing compliant containment of the fluid block and thermoelectric module over the pedestal of said pedestal assembly with a compliant z-axis force.

2. The thermal control unit of claim 1 wherein said spring loaded pusher mechanism includes a pusher plate attached to the bottom side of the top wall of said cover housing so as to allow z-axis travel of the pusher plate, said pusher plate being spring loaded for exerting a predetermined z-axis pushing force on said fluid block.

3. The thermal control unit of claim 2 wherein said pusher plate is spring-loaded by a plurality of springs distributed beneath and held in compression against the top wall of said cover housing by said pusher plate.

4. The thermal control unit of claim 3 wherein said each of said plurality of springs is provided in the form of stacked disc springs.

5. The thermal control unit of claim 3 wherein a plurality of spring cavities are provided in the bottom side of the top wall of said cover housing, and wherein said springs are disposed in and contained by said spring cavities and project from said spring cavities a sufficient distance to exert a force on said pusher plate and to allow a degree of z-axis travel of said pusher plate.

6. The thermal control unit of claim 3 wherein a plurality of alignment pins are provided in the top wall of said cover housing so as to extend from the bottom side of the top wall of said cover housing, said pusher plate and fluid block containing corresponding pin holes for receiving said alignment pins, and further wherein said plurality of springs surround said alignment pins.

7. The thermal control unit of claim 3 wherein at least some of said alignment pins also extend from the top side of the top wall of said cover housing for providing means for aligning a gimbal system for a pusher element over the cover housing.

8. The thermal control unit of claim 1 wherein said fluid block includes a fluid inlet and fluid outlet and said cover housing includes fluid line coupler openings for accommodating fluid inlet and outlet lines.

9. The thermal control unit of claim 1 wherein the temperature sensor in said pedestal assembly has leads, and wherein quick-disconnect means are provided in said pedestal assembly and cover housing wherein the temperature sensor leads are automatically connected to wiring provided in said cover housing when said cover housing is attached to said pedestal assembly.

10. The thermal control unit of claim 1 wherein said pedestal assembly has a top perimeter edge and said cover housing has a side wall which contacts the top perimeter edge of the pedestal assembly when the cover housing is attached thereto, wherein the temperature sensor leads run to the top perimeter edge of the pedestal assembly, and wherein said quick-disconnect means includes an interposer at the side wall of said cover assembly for connecting the temperature sensor leads to wiring provided in the side wall of the cover assembly.

11. The thermal control unit of claim 1 wherein said pusher plate is a plastic pusher plate.

12. The thermal control unit of claim 11 wherein said plastic pusher plate is spring-loaded by a plurality of springs distributed beneath and held in compression in the top wall of said cover housing by said pusher plate.

13. The thermal control unit of claim 12 wherein said each of said plurality of springs is provided in the form of stacked disc springs.

14. A thermal control unit for maintaining the set point temperature on an IC device under test (DUT) comprising
- a pedestal assembly having a heat conductive pedestal, said pedestal having a bottom end for contacting a DUT and a temperature sensor in said bottom end for monitoring the temperature of the DUT,
- a fluid block above said pedestal assembly having a fluid inlet and fluid outlet for circulating a fluid therethrough,
- a thermoelectric module between the pedestal of said pedestal assembly and said fluid block for controlling the heat flow between said pedestal and fluid block, and
- means for compliant containment of the thermoelectric module between the fluid block and the pedestal of said pedestal assembly with a compliant pushing force on the fluid block.

15. A thermal control unit for maintaining the set point temperature on an IC device under test (DUT) comprising
- a pedestal assembly having a pedestal frame and heat conductive pedestal held in said pedestal frame, said pedestal having a bottom end for contacting a DUT and a temperature sensor in said bottom end for monitoring the temperature of the DUT,
- a fluid block above said pedestal assembly having a fluid inlet and fluid outlet for circulating a fluid therethrough,
- a thermoelectric module between the pedestal of said pedestal assembly and said fluid block for controlling heat flow between said pedestal and fluid block for controlling the temperature of the DUT contacted by the bottom end of said pedestal,
- a cover housing removably attached to the pedestal frame of said pedestal assembly for containing the fluid block and thermoelectric module in stacked relation over the pedestal of said pedestal assembly along a z-axis, said cover assembly having a top wall extending over said fluid block, said top wall having a top side for receiving a z-axis pushing force and a bottom side,
- a pusher plate attached to the bottom side of the top wall of said cover housing so as to allow z-axis travel of the pusher plate, said pusher plate being positioned between the top wall of said cover housing and said fluid block and being spring loaded for exerting a compliant z-axis pushing force on said fluid block for compliant containment of the fluid block and thermoelectric module over the pedestal of said pedestal assembly.

16. A thermal control unit for maintaining the set point temperature on an IC device under test (DUT) comprising
- a pedestal assembly including a pedestal frame having a top perimeter edge and heat conductive pedestal held in said pedestal frame, said pedestal having a bottom end for contacting a DUT and a temperature sensor in said bottom end for monitoring the temperature of the DUT, the thermal sensor in said pedestal having sensor leads extending through the pedestal frame to the top perimeter edge thereof,
- a fluid block above said pedestal assembly having a fluid inlet and fluid outlet for circulating a fluid therethrough,
- a thermoelectric module between the pedestal of said pedestal assembly and said fluid block for controlling heat flow between said pedestal and fluid block for controlling the temperature of the DUT contacted by the bottom end of said pedestal,
- a cover housing removably attached to the pedestal frame of said pedestal assembly for containing the fluid block and thermoelectric module in stacked relation over the pedestal of said pedestal assembly along a z-axis, said cover assembly having side walls and a top wall extending over said fluid block, said top wall having a top side for receiving a z-axis pushing force and a bottom side, one of the side walls of said cover housing having quick-connect means for connecting the temperature sensor leads running through the pedestal frame to wiring provided in the side wall of the cover assembly when the cover housing is attached to the pedestal assembly, and
- a spring loaded pusher mechanism at the bottom side of the top wall of said cover housing for producing compliant containment of the fluid block and thermoelectric module over the pedestal of said pedestal assembly with a compliant z-axis force.

* * * * *

UNITED STATES PATENT AND TRADEMARK OFFICE
CERTIFICATE OF CORRECTION

PATENT NO. : 7,663,388 B2  
APPLICATION NO. : 12/080248  
DATED : February 16, 2010  
INVENTOR(S) : Nasser Barabi et al.

It is certified that error appears in the above-identified patent and that said Letters Patent is hereby corrected as shown below:

Column 1, line 29, "act" should read --acts--.
Column 1, line 44, "and to providing" should read --and providing--.
Column 3, line 31, --of-- should be inserted between "plurality" and "compressed".
Column 3, line 63, "by used" should read --be used--.
Column 5, line 64, "having heat" should read --having a heat--.
Column 6, line 30, "wherein said each" should read --wherein each--.

Signed and Sealed this

Twenty-ninth Day of June, 2010

David J. Kappos
*Director of the United States Patent and Trademark Office*